United States Patent
Tapily et al.

(10) Patent No.: US 9,607,829 B2
(45) Date of Patent: Mar. 28, 2017

(54) METHOD OF SURFACE FUNCTIONALIZATION FOR HIGH-K DEPOSITION

(71) Applicant: Tokyo Electron Limited, Minato-ku, Tokyo (JP)

(72) Inventors: Kandabara N. Tapily, Mechanicville, NY (US); Robert D. Clark, Livermore, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/619,984

(22) Filed: Feb. 11, 2015

(65) Prior Publication Data

US 2015/0228478 A1    Aug. 13, 2015

Related U.S. Application Data

(60) Provisional application No. 61/938,316, filed on Feb. 11, 2014.

(51) Int. Cl.
*H01L 21/469* (2006.01)
*H01L 21/02* (2006.01)
(Continued)

(52) U.S. Cl.
CPC .... *H01L 21/02312* (2013.01); *H01L 21/0228* (2013.01); *H01L 21/02178* (2013.01);
(Continued)

(58) Field of Classification Search
CPC ............ H01L 29/1004; H01L 29/0821; H01L 29/7371; H01L 29/0649; H01L 29/0826;
(Continued)

(56) References Cited

U.S. PATENT DOCUMENTS

2003/0049942 A1* 3/2003 Haukka ............ H01L 21/02052
    438/778
2003/0060057 A1* 3/2003 Raaijmakers ..... H01L 21/02238
    438/770
(Continued)

OTHER PUBLICATIONS

Reinhardt, K.A. and Reidy, R.E. (editors), Handbook of Cleaning for Semiconductor Manufacturing, Publication date Jan. 11, 2011, pp. 258-259, Wiley, Hoboken, USA.

*Primary Examiner* — Robert Bachner
(74) *Attorney, Agent, or Firm* — Wood Herron & Evans LLP

(57) ABSTRACT

A method of surface functionalization for high-k deposition is provided in several embodiments. The method provides interface layer growth with low effective oxide thickness and good nucleation behavior for high-k deposition. The method includes providing a substrate that is at least substantially free of oxygen on a surface of the substrate, forming an interface layer on the surface of the substrate by exposing the surface of the substrate to one or more pulses of ozone gas, modifying the interface layer by exposing the interface layer to one or more pulses of a treatment gas containing a functional group to form a functionalized interface layer terminated with the functional group, and depositing a high-k film on the functionalized interface layer.

20 Claims, 4 Drawing Sheets

(51) Int. Cl.
*H01L 21/28* (2006.01)
*H01L 29/51* (2006.01)

(52) U.S. Cl.
CPC .. *H01L 21/02304* (2013.01); *H01L 21/28194* (2013.01); *H01L 21/28211* (2013.01); *H01L 29/518* (2013.01); *H01L 29/513* (2013.01); *H01L 29/517* (2013.01)

(58) Field of Classification Search
CPC ......... H01L 29/66242; H01L 29/66272; H01L 29/0817; H01L 29/732; H01L 21/324; H01L 29/16; H01L 29/0808; H01L 29/1008
See application file for complete search history.

(56) References Cited

U.S. PATENT DOCUMENTS

2008/0078987 A1\* 4/2008 Leusink ................ H01L 29/518
257/19
2013/0203230 A1 8/2013 Chen et al.
2013/0292807 A1 11/2013 Raisanen et al.

\* cited by examiner

METHOD OF SURFACE FUNCTIONALIZATION FOR HIGH-K DEPOSITION

CROSS-REFERENCE TO RELATED APPLICATIONS

This application is related to and claims priority to U.S. Provisional Patent Application Ser. No. 61/938,316 filed on Feb. 11, 2014, the entire contents of which are herein incorporated by reference.

FIELD OF INVENTION

The present invention relates to the field of integrating high dielectric constant (high-k) films into semiconductor manufacturing, and more particularly to a method of surface functionalization for high-k film deposition onto a substrate.

BACKGROUND OF THE INVENTION

High-k materials such as $HfO_2$-based dielectrics have successfully replaced $SiO_2$ in the state of the art complementary metal-oxide-semiconductor (CMOS) technology. In order to further scale the $HfO_2$-based gate dielectric, one approach to scale the equivalent oxide thickness (EOT) is to reduce the overall dielectric thickness including the thickness of a $SiO_2$ interface layer. Using a zero thickness interface layer by depositing a high-k material directly onto a Si substrate suffers from nucleation problems and long incubation time during the initial deposition of the high-k material. The nucleation problems result in poor material and electrical properties of the high-k material which leads to degradation of the device performance. In one example, atomic layer deposition (ALD) of a high-k material on a hydrogen-terminated Si surface can lead to island-like growth of a discontinuous high-k film.

These and other problems that are encountered in scaling of advanced CMOS technology need to be solved in order to further integrate the use of high-k materials into semiconductor devices.

SUMMARY OF THE INVENTION

A method is provided for forming a high-k film on a functionalized interface layer with a low EOT. The functionalized interface layer provides good nucleation characteristics for high-k film deposition on a substrate.

According to one embodiment, the method includes providing a substrate that is at least substantially free of oxygen on a surface of the substrate, forming an interface layer on the surface of the substrate by exposing the surface of the substrate to one or more pulses of ozone gas, modifying the interface layer by exposing the interface layer to one or more pulses of a treatment gas containing a functional group to form a functionalized interface layer terminated with the functional group, and depositing a high-k film on the functionalized interface layer.

According to another embodiment, the method includes providing a Si substrate that is at least substantially free of oxygen on a surface of the substrate, forming a $SiO_2$ interface layer on the surface of the Si substrate by exposing the surface of the substrate to a plurality of ozone gas pulses, where a thickness of the $SiO_2$ interface layer is less than 5 Å. The method further includes modifying the $SiO_2$ interface layer with a plurality of pulses of a treatment gas containing a —OH functional group to form a functionalized surface terminated with the —OH functional group, and depositing a high-k film on the functionalized surface by atomic layer deposition (ALD).

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Methods for depositing thin high-k films with good material and electrical properties for semiconductor devices are disclosed in various embodiments. According to one embodiment, a method of surface functionalization for subsequent high-k deposition is disclosed that provides a very thin and well-controlled interface layer growth, followed by high-k film deposition with good film nucleation behavior.

One skilled in the relevant art will recognize that the various embodiments may be practiced without one or more of the specific details described herein, or with other replacement and/or additional methods, materials, or components. In other instances, well-known structures, materials, or operations are not shown or described in detail herein to avoid obscuring aspects of various embodiments of the invention. Similarly, for purposes of explanation, specific numbers, materials, and configurations are set forth herein in order to provide a thorough understanding of the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention.

Figure 1:
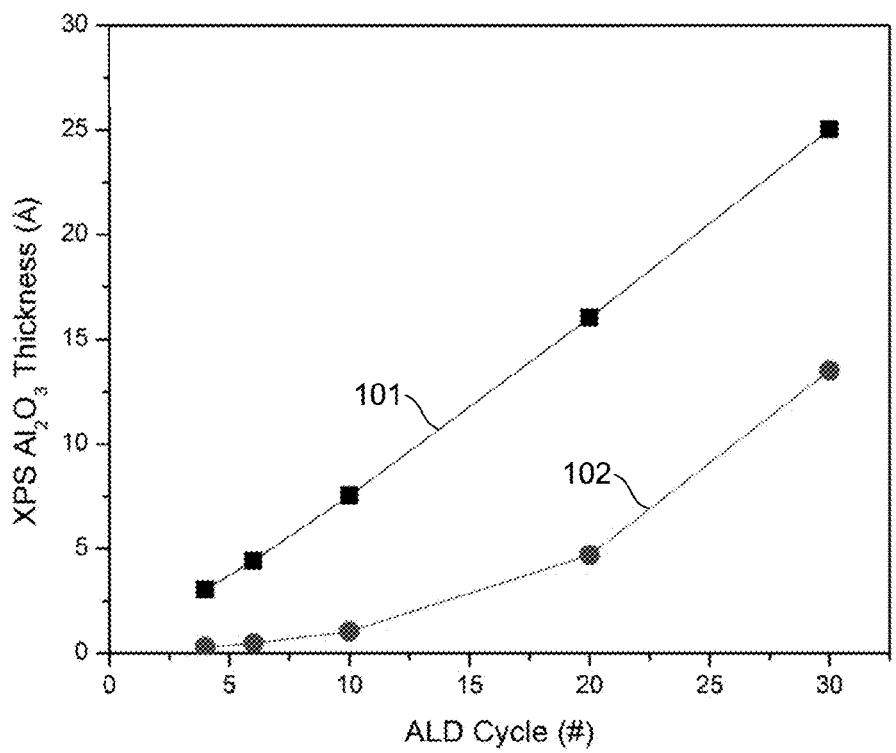
FIG. 1 shows $Al_2O_3$ film thickness on different substrate surfaces as a function of number of $Al_2O_3$ ALD cycles.
Figure 2:
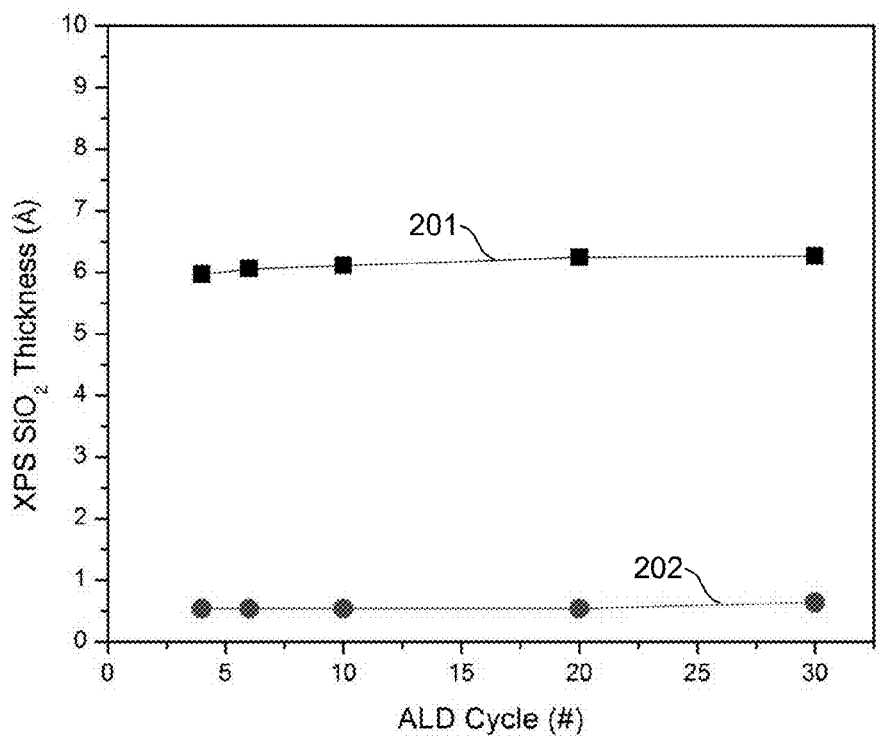
FIG. 2 shows $SiO_2$ thickness as a function of number of $Al_2O_3$ ALD cycles.

Conventional methods for preparing substrate surfaces for subsequent high-k deposition suffer from numerous problems. One method includes forming a hydrogen-terminated Si surface and thereafter depositing a high-k film on the hydrogen-terminated Si surface. Another method includes depositing a chemical oxide interface layer using a wet process and thereafter depositing a high-k film on the chemical oxide interface layer. FIGS. 1 and 2 illustrate some of the problems associated with these two methods.

FIG. 1 shows $Al_2O_3$ film thickness on different substrate surfaces as a function of number of $Al_2O_3$ ALD cycles. The $Al_2O_3$ films were deposited using alternating gaseous exposures of trimethyl aluminum (TMA) and $H_2O$ at a substrate temperature of about 250° C., and the $Al_2O_3$ film thickness was measured by X-ray photoelectron spectroscopy (XPS). The $Al_2O_3$ films were deposited on a chemical oxide interface layer ($SiO_2$) (trace 101), and on a clean hydrogen-terminated Si surface (trace 102). The chemical oxide interface layer was formed using a conventional process recipe, including a dilute HF (DHF) dip to remove the native $SiO_2$ layer, a SPM ($H_2SO_4$:$H_2O_2$) dip, followed by a SC1 ($NH_4O_2$:$H_2O_2$) dip, and $O_3$ and HCl rinses. The clean hydrogen-terminated Si surface was prepared by a DHF dip. FIG. 1 shows that good linear $Al_2O_3$ film deposition is observed on the chemical oxide interface layer with no discernable incubation time which indicates good film nucleation characteristics. In contrast, clear incubation time is observed for $Al_2O_3$ film deposition on the clean hydrogen-terminated Si surface which indicates poor nucleation characteristics and island-like growth of a discontinuous $Al_2O_3$ film.

FIG. 2 shows $SiO_2$ thickness as a function of number of $Al_2O_3$ ALD cycles. Trace 201 shows that the $SiO_2$ interface layer has a thickness of about 6 Angstrom (Å) for 5-30 $Al_2O_3$ ALD cycles on a chemical oxide interface layer. For comparison, trace 202 shows that the $SiO_2$ interface layer has a thickness of only about 0.5 Å for 5-30 $Al_2O_3$ ALD cycles on a clean hydrogen terminated Si surface.

The results in FIGS. 1 and 2 illustrate that although $Al_2O_3$ ALD shows good deposition characteristics on the chemical oxide interface layer, the chemical oxide interface layer in trace 201 is unacceptably thick for the purposes of scaling the equivalent oxide thickness (EOT) of a film structure containing a chemical oxide interface layer and the $Al_2O_3$ film. Furthermore, although $Al_2O_3$ ALD deposition shows a very thin $SiO_2$ interface layer on the clean hydrogen-terminated Si surface, the deposition characteristics on the clean Si surface are not acceptable for manufacturing of advanced semiconductor devices.

The inventors have realized that new methods are needed for providing a very thin and well-controlled interface layer growth that enables short incubation time and good nucleation behavior for a subsequent high-k film deposition on the interface layer. According to one embodiment of the invention, a method is described that includes providing a substrate that is at least substantially free of oxygen on a surface of the substrate, forming an interface layer on the surface of the substrate by exposing the surface of the substrate to one or more pulses of ozone gas, modifying the interface layer with one or more pulses of a treatment gas containing a functional group to form a functionalized surface terminated with the functional group, and depositing a high-k film on the functionalized surface.

Figure 3:
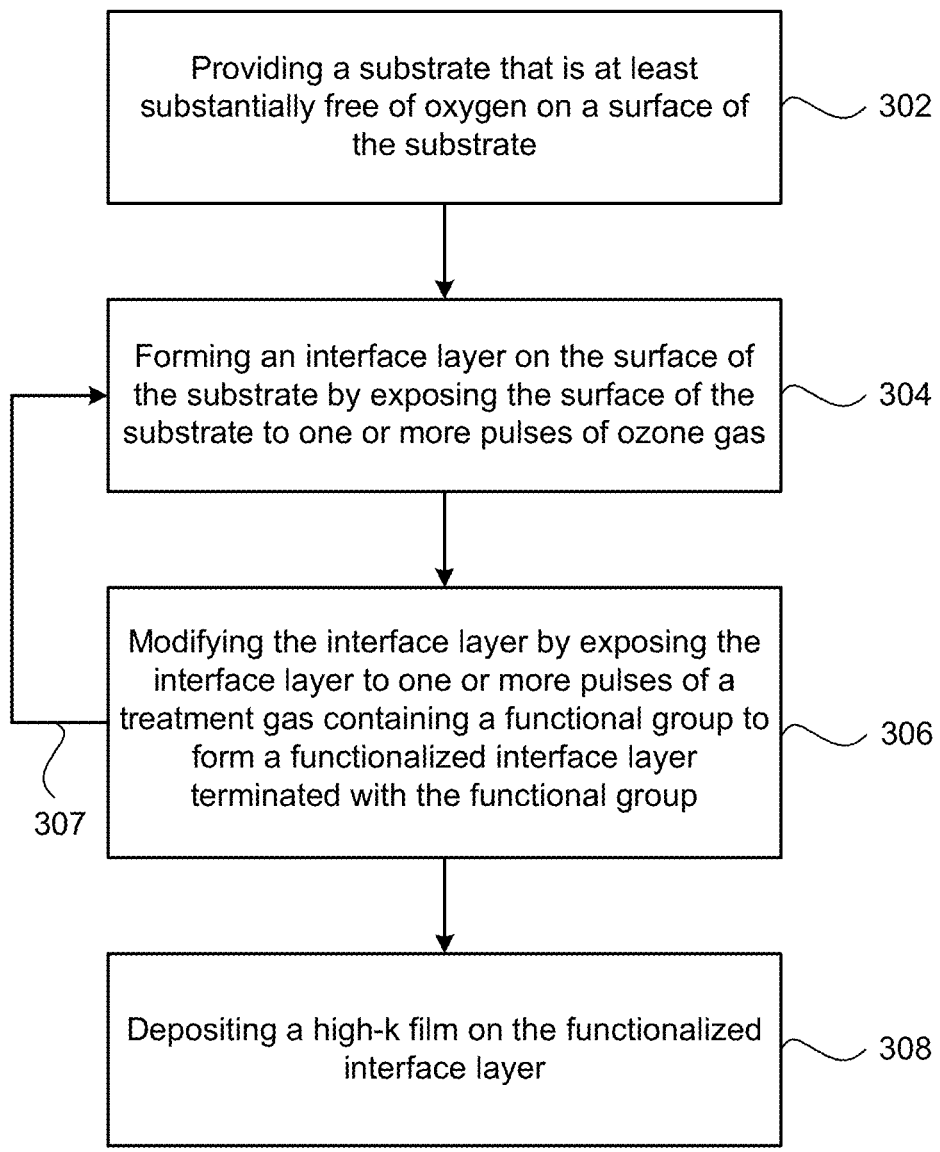
FIG. 3 is a process flow diagram of a method of surface functionalization and high-k deposition according to an embodiment of the invention.

FIG. 3 is a process flow diagram of a method of surface functionalization and high-k deposition according to an embodiment of the invention. The method includes, in 302, providing a substrate that is at least substantially free of oxygen on a surface of the substrate. The substrate can be of any size, for example a 200 mm substrate, a 300 mm substrate, or an even larger substrate. According to one embodiment, the substrate can contain Si, for example crystalline Si, polycrystalline Si, or amorphous Si. In one example, the substrate can be a tensile-strained Si layer. According to another embodiment, the substrate may contain Ge or $Si_xGe_{1-x}$ compounds, where x is the atomic fraction of Si, 1-x is the atomic fraction of Ge, and 0<(1-x)<1. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate can be a compressive-strained Ge layer or a tensile-strained $Si_xGe_{1-x}$ (x>0.5) deposited on a relaxed $Si_{0.5}Ge_{0.5}$ buffer layer. A substrate surface that is at least substantially free of oxygen can be a hydrogen-terminated surface that may be prepared by a DHF dip and thereafter moved to a process chamber of a vacuum processing tool. In another example, a hydrogen-terminated surface may be prepared by subjecting the substrate to a chemical oxide removal (COR) process that includes simultaneous or sequential gas exposures of HF and $NH_3$, followed by a heat-treatment to remove reaction products from the substrate surface.

The method further includes, in 304, forming an interface layer on the surface of the substrate by exposing the surface of the substrate to one or more pulses of ozone gas. In one example, ozone gas exposure may be carried out by flowing an $O_3$/$O_2$ mixture from an external ozone generator into the process chamber. In some examples, the one or more pulses of ozone gas can include between 2 and 10 pulses and each pulse can have a pulse duration between 1 and 30 seconds. The interface layer can, for example, have a thickness less than about 6 Å, less than about 5 Å, or less than about 4 Å. In some examples, the interface layer can have a thickness between about 2 Å and about 4 Å, between about 3 Å and about 4 Å, between about 4 Å and about 5 Å, or between about 5 Å and about 6 Å. The substrate temperature can, for example, be between about 100° C. and about 400° C., between about 100° C. and about 200° C., between about 200° C. and about 300° C., or between about 300° C. and about 400° C. In one example, the substrate can be a Si substrate and the substrate temperature can be about 250° C.

The method further includes, in 306, modifying the interface layer by exposing the interface layer to one or more pulses of a treatment gas containing a functional group to form a functionalized interface layer terminated with the functional group. The treatment gas can, for example, be selected from the group consisting of $H_2O$, $H_2O_2$, and $NH_3$. The functional group includes a hydroxyl group (—OH), —NH, or —$NH_2$. In some examples, the one or more pulses of the treatment gas can include between 2 and 10 pulses and each pulse can have a pulse duration between 1 and 60 seconds. In one example, the substrate can be a Si substrate and the substrate temperature can be about 250° C.

As indicated by process arrow 307, steps 304 and 306 may be repeated one or more times.

The method further includes, in 308, depositing a high-k film on the functionalized interface layer. The high-k film may be deposited by a gas phase deposition method, for example ALD, chemical vapor deposition (CVD), plasma-enhanced CVD (PECVD), plasma-enhanced ALD (PEALD), or pulsed CVD. A thickness of the high-k film can, for example, between about 2 Å and about 30 Å, between about 5 Å and about 20 Å, or between about 5 Å and about 10 Å. The substrate temperature can, for example, be between about 100° C. and about 400° C., between about 100° C. and about 200° C., between about 200° C. and about 300° C., or between about 300° C. and about 400° C. In one example, the substrate can be a Si substrate and the substrate temperature can be about 250° C.

According to one embodiment, steps 304, 306, and 308 may be performed in a single process chamber in order to improve throughput and avoid exposure to air. Further, two or more of steps 304, 306, and 308 may be performed at substantially the same substrate temperature.

According to one embodiment, the high-k film can contain an alkaline earth element, aluminum, titanium, hafnium, zirconium, or a rare earth element, or any combination of two or more thereof. According to some embodiments, the high-k film may contain an element selected from the Periodic Table of the Elements that is capable of forming a high-k film, for example an oxide film, a nitride film, or an oxynitride film. Examples include $HfO_2$, $ZrO_2$, $HfZrO_2$, $TiO_2$, and $Al_2O_3$.

According to some embodiments, a rare earth-based high-k film can include an oxide, nitride, or oxynitride film containing yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), or ytterbium (Yb), or any combinations of two or more thereof. Examples of rare earth oxide high-k films include lanthanum oxide ($La_2O_3$), lutetium oxide ($Lu_2O_3$), and lanthanum lutetium oxide ($LaLuO_3$).

Figure 4:
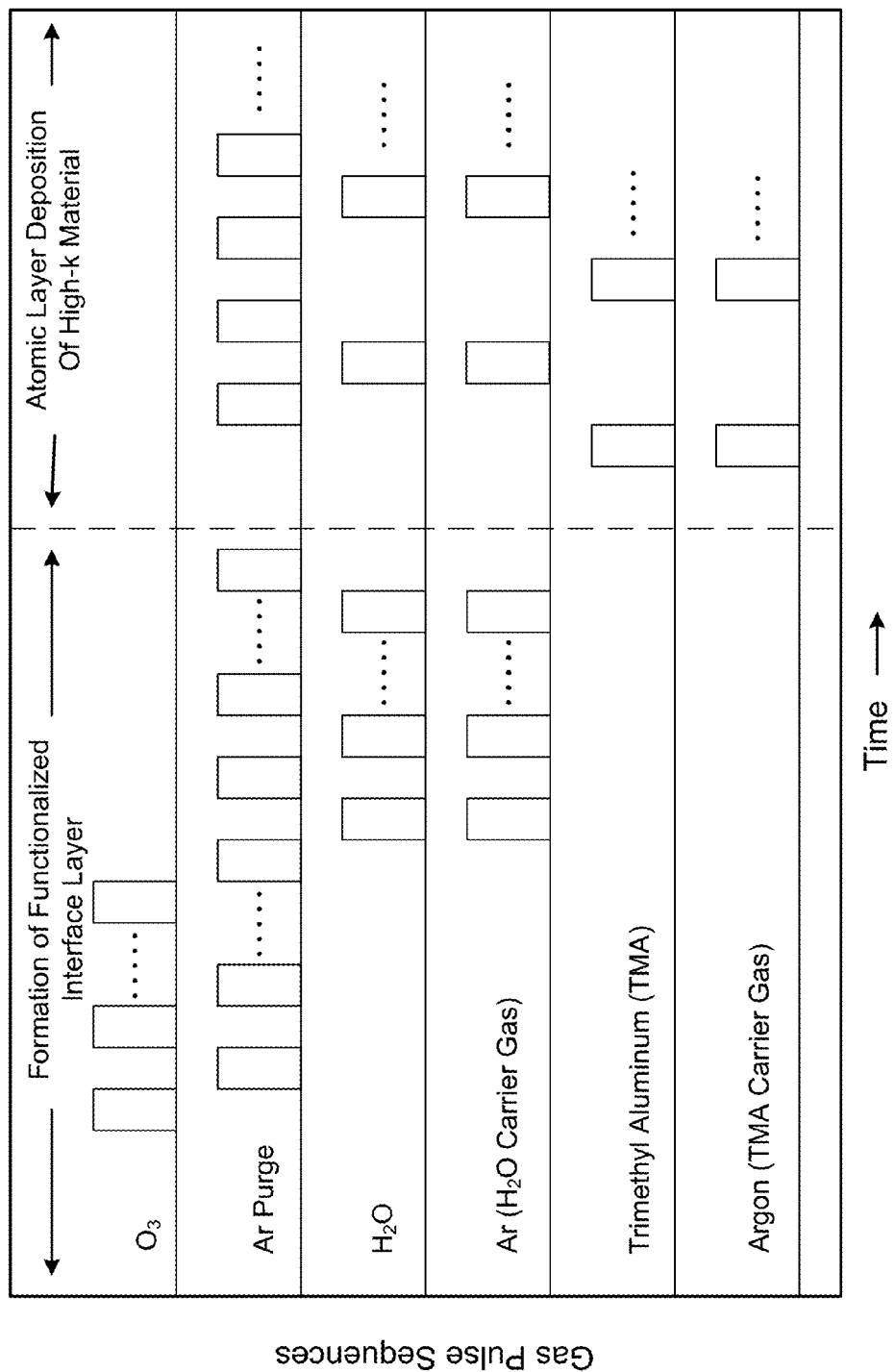
FIG. 4 is a gas pulse diagram according to one embodiment of the invention.

FIG. 4 is a gas pulse diagram according to one embodiment of the invention. The pulse diagram shows formation of a functionalized interface layer followed by ALD of a high-k film on the functionalized interface layer. The exemplary high-k material shown in FIG. 4 is $Al_2O_3$.

The formation of the functionalized interface layer includes exposing a clean substrate (e.g., a hydrogen-terminated Si substrate) in a process chamber to one or more sequential $O_3$ gas pulses that are separated by pulses of Ar purge gas. Thereafter, the method includes exposing the substrate to one or more sequential $H_2O$ gas pulses (with an Ar carrier gas) that are separated by pulses of Ar purge gas. The pulses of Ar purge gas remove reactant gases and reaction by-products from the process chamber. Exemplary gas pulse durations include 10 seconds for $O_3$, 40 seconds for $H_2O$, and 3 seconds for Ar purge. Exemplary gas flow rates include 300 sccm for the Ar carrier gas for $H_2O$, and 3000 sccm for the Ar purge gas. In one example the substrate holder temperature can be 250° C. The above gas pulse sequence for the nucleation layer deposition may be repeated one or more times until the functionalized interface layer has the desired thickness and nucleation properties for the subsequent $Al_2O_3$ ALD.

Following the formation of the functionalized interface layer, an $Al_2O_3$ film is deposited on the functionalized interface layer. The $Al_2O_3$ ALD includes exposing the functionalized interface layer to one or more sequential TMA gas pulses (with an Ar carrier gas) and $H_2O$ gas pulses (with an Ar carrier gas). The pulses of Ar purge gas remove reactant gases and reaction by-products from the process chamber. Exemplary gas pulse durations include 6 seconds for TMA, 0.8 seconds for $H_2O$, and 3 seconds for Ar purge. Exemplary gas flow rates include 100 sccm for the Ar carrier gas for TMA, 300 sccm for the Ar carrier gas for $H_2O$, and 3000 sccm for the Ar purge gas. In one example, the substrate holder temperature can be 250° C. for the $Al_2O_3$ ALD. The above gas pulse sequence for the $Al_2O_3$ deposition may be repeated one or more times until the $Al_2O_3$ film has a desired thickness for the semiconductor device.

Figure 5:
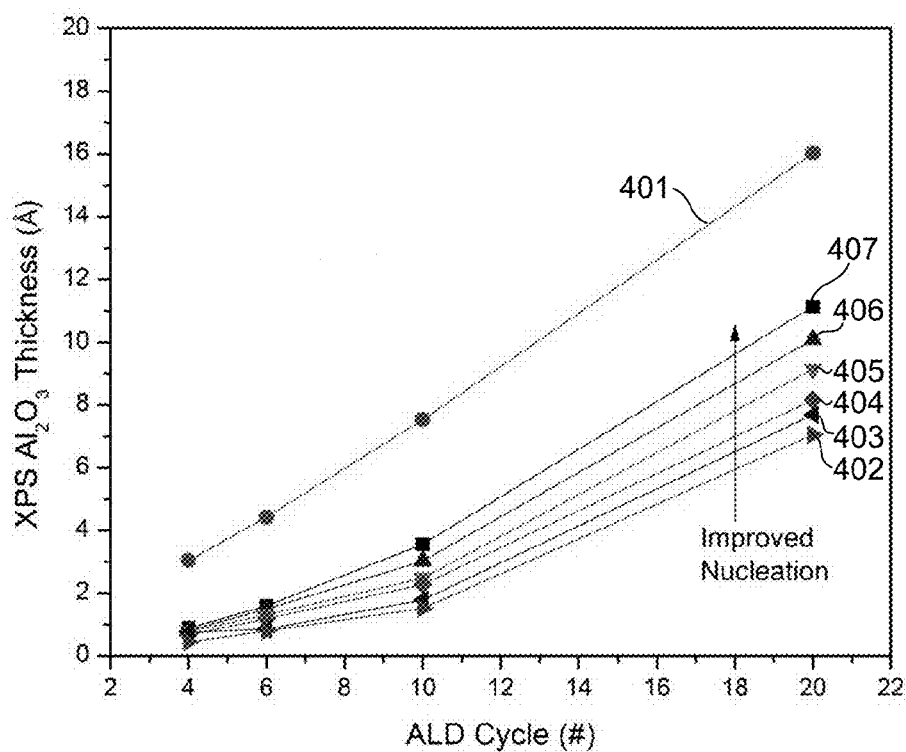
FIG. 5 shows $Al_2O_3$ film thickness as a function of number of $Al_2O_3$ ALD cycles on different interface layers according to embodiments of the invention.

FIG. 5 shows $Al_2O_3$ film thickness as a function of number of $Al_2O_3$ ALD cycles on different interface layers according to embodiments of the invention. The different interface layers included a chemical oxide interface layer (trace 401), and an interface layer formed by 10 cycles of alternating gas pulses of $H_2O$ (38 seconds each) and Ar purge (trace 402). The functionalized interface layers in traces 403-407 were formed using gas pulse sequences that included a) an $O_3$ pulse (10 seconds), followed by b) 10 $H_2O$ pulses (38 seconds each). The gas pulse sequences for traces 403-407 was performed 1, 2, 3, 6, and 10 times, respectively. The results in traces 403-407 show the improved nucleation properties of the $Al_2O_3$ ALD as the number of times the gas pulse sequence a)+b) was performed increased, and the improved nucleation properties approach that of the chemical oxide interface layer.

Figure 6:
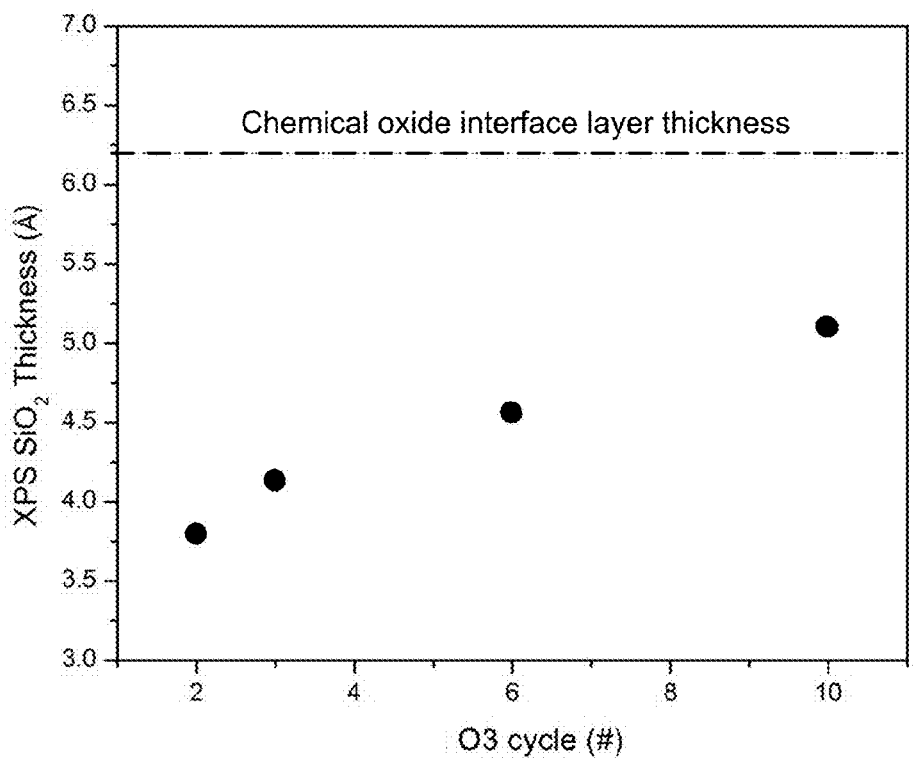
FIG. 6 shows $SiO_2$ thickness as a function of number of $O_3$ cycles according to an embodiment of the invention.

FIG. 6 shows $SiO_2$ thickness as a function of number of $O_3$ cycles according to an embodiment of the invention. A hydrogen-terminated Si substrate was exposed to 2-10 cycles of $O_3$ pulses, resulting in formation of $SiO_2$ interface layers with thicknesses ranging from about 3.7 Å to about 5 Å. This compares to a thickness of about 6.5 Å for a chemical oxide interface layer. FIG. 5 shows that the $SiO_2$ interface layer thickness can be accurately controlled below the thickness of a chemical oxide interface layer by selecting the number of $O_3$ pulses.

For comparison, nucleation layers that were formed using only one or more $O_3$ gas pulses or only one or more $H_2O$ gas pulses did not show any significant improvement in the high-k film deposition characteristics over a hydrogen-terminated Si surface.

Film structures containing the interface layer and the high-k film may be further processed to form a semiconductor device. In one example, the film structure may be processed in replacement gate process flow or in a gate first process flow. In another example, the film structure may be processed to form a contact structure for a metal/semiconductor contact where the contact resistivity may be tuned by inserting the interface layer as a Schottky Barrier Height (SBH) layers between the metal and the semiconductor in order to decrease metal-induced gap state penetration as well as to adjust the contact SBH. The SBH adjustment relies on the formation of a dipole layer at the dielectric/$SiO_2$ interface.

Embodiments of the invention may utilize a wide variety of hafnium and zirconium precursors for deposition of the high-k film. For example, representative examples include: $Hf(O^tBu)_4$ (hafnium tert-butoxide, HTB), $Hf(NEt_2)_4$ (tetrakis(diethylamido)hafnium, TDEAH), $Hf(NEtMe)_4$ (tetrakis(ethylmethylamido)hafnium, TEMAH), $Hf(NMe_2)_4$ (tetrakis(dimethylamido)hafnium, TDMAH), $Zr(O^tBu)_4$ (zirconium tert-butoxide, ZTB), $Zr(NEt_2)_4$ (tetrakis(diethylamido)zirconium, TDEAZ), $Zr(NMeEt)_4$ (tetrakis(ethylmethylamido)zirconium, TEMAZ), $Zr(NMe_2)_4$ (tetrakis(dimethylamido)zirconium, TDMAZ), $Hf(mmp)_4$, $Zr(mmp)_4$, $HfCl_4$, $ZrCl_4$, $ZrCp_2Me_2$, $Zr(tBuCp)_2Me_2$, and $Zr(NiPr_2)_4$. In one example, the hafnium and zirconium precursors may have the same ligands (e.g., HTB and ZTB), thereby preventing any possible detrimental ligand exchange between the precursors.

Embodiments of the invention may utilize a wide variety of aluminum precursors. For example, many aluminum precursors have the formula:

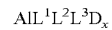

$$AlL^1L^2L^3D_x$$

where $L^1$, $L^2$, $L^3$ are individual anionic ligands, and D is a neutral donor ligand where x can be 0, 1, or 2. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles. Other examples of aluminum precursors include: $AlMe_3$, $AlEt_3$, $AlMe_2H$, $[Al(OsBu)_3]_4$, $Al(CH_3COCHCOCH_3)_3$, $AlCl_3$, $AlBr_3$, $AlI_3$, $Al(OiPr)_3$, $[Al(NMe_2)_3]_2$, $Al(iBu)_2Cl$, $Al(iBu)_3$, $Al(iBu)_2H$, AlEt$_2$Cl, Et$_3$Al$_2$(OsBu)$_3$, Al(THD)$_3$, H$_3$AlNMe$_3$, H$_3$AlNEt$_3$, H$_3$AlNMe$_2$Et, and H$_3$AlMeEt$_2$.

Embodiments of the inventions may utilize a wide variety of different rare earth precursors. For example, many rare earth precursors have the formula:

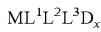

$$ML^1L^2L^3D_x$$

where M is a rare earth metal element selected from the group of yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). $L^1$, $L^2$, $L^3$ are individual anionic ligands, and D is a neutral donor ligand where x can be 0, 1, 2, or 3. Each $L^1$, $L^2$, $L^3$ ligand may be individually selected from the groups of alkoxides, halides, aryloxides, amides, cyclopentadienyls, alkyls, silyls, amidinates, -diketonates, ketoiminates, silanoates, and carboxylates. D ligands may be selected from groups of ethers, furans, pyridines, pyroles, pyrolidines, amines, crown ethers, glymes, and nitriles. Examples of L group alkoxides include tert-butoxide, iso-propoxide, ethoxide, 1-methoxy-2,2-dimethyl-2-propionate (mmp), 1-dimethylamino-2,2'-dimethylpropionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclopentadienyls include cyclopentadienyl, 1-methylcyclopentadienyl, 1,2,3,4-tetramethylcyclopentadienyl, 1-ethylcyclopentadienyl, pentamethylcyclopentadienyl, 1-iso-propylcyclopentadienyl, 1-n-propylcyclopentadienyl, and 1-n-butylcyclopentadienyl. Examples of alkyls include bis(trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of -diketonates include 2,2,6,6-tetramethyl-3,5-heptanedionate (THD), hexafluoro-2,4-pentandionate, and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6, 10-Crown-4, pyridine, N-methylpyrolidine, triethylamine, trimethylamine, acetonitrile, and 2,2-dimethylpropionitrile.

Representative examples of rare earth precursors include:

Y precursors: Y(N(SiMe$_3$)$_2$)$_3$, Y(N($^i$PR)$_2$)$_3$, Y(N($^t$Bu)SiMe$_3$)$_3$, Y(TMPD)$_3$, Cp$_3$Y, (MeCp)$_3$Y, ((nPr)Cp)$_3$Y, ((nBu)Cp)$_3$Y, Y(OCMe$_2$CH$_2$NMe$_2$)$_3$, Y(THD)$_3$, Y[OOCCH(C$_2$H$_5$)C$_4$H$_9$]$_3$, Y(C$_{11}$H$_{19}$O$_2$)$_3$CH$_3$(OCH$_2$CH$_2$)$_3$OCH$_3$, Y(CF$_3$COCHCOCF$_3$)$_3$, Y(OOCC$_{10}$H$_7$)$_3$, Y(OOC$_{10}$H$_{19}$)$_3$, and Y(O($^i$Pr))$_3$.

La precursors: La(N(SiMe$_3$)$_2$)$_3$, La(N($^i$Pr)$_2$)$_3$, La(N($^t$Bu)SiMe$_3$)$_3$, La(TMPD)$_3$, (($^i$Pr)Cp)$_3$La, Cp$_3$La, Cp$_3$La(NCCH$_3$)$_2$, La(Me$_2$NC$_2$H$_4$Cp)$_3$, La(THD)$_3$, La[OOCCH(C$_2$H$_5$)C$_4$H$_9$]$_3$, La(C$_{11}$H$_{19}$O$_2$)$_3$.CH$_3$(OCH$_2$CH$_2$)$_3$OCH$_3$, La(C$_{11}$H$_{19}$O$_2$)$_3$.CH$_3$(OCH$_2$CH$_2$)$_4$OCH$_3$, La(O($^i$Pr))$_3$, La(OEt)$_3$, La(acac)$_3$, La((($^t$Bu)$_2$N)$_2$CMe)$_3$, La((($^i$Pr)$_2$N)$_2$CMe)$_3$, La((($^i$Pr)$_2$N)$_2$CH)$_3$, La((($^t$Bu)$_2$N)$_2$C(tBu))$_3$, La((($^i$Pr)$_2$N)$_2$C($^t$Bu))$_3$, and La(FOD)$_3$.

Ce precursors: Ce(N(SiMe$_3$)$_2$)$_3$, Ce(N($^i$Pr)$_2$)$_3$, Ce(N($^t$Bu)SiMe$_3$)$_3$, Ce(TMPD)$_3$, Ce(FOD)$_3$, (($^i$Pr)Cp)$_3$Ce, Cp$_3$Ce, Ce(Me$_4$Cp)$_3$, Ce(OCMe$_2$CH$_2$NMe$_2$)$_3$, Ce(THD)$_3$, Ce[OOCCH(C$_2$H$_5$)C$_4$H$_9$]$_3$, Ce(C$_{11}$H$_{19}$O$_2$)$_3$.CH$_3$(OCH$_2$CH$_2$)$_3$OCH$_3$, Ce(C$_{11}$H$_{19}$O$_2$)$_3$.CH$_3$(OCH$_2$CH$_2$)$_4$OCH$_3$, Ce(O($^i$Pr))$_3$, and Ce(acac)$_3$.

Pr precursors: Pr(N(SiMe$_3$)$_2$)$_3$, (($^i$Pr)Cp)$_3$Pr, Cp$_3$Pr, Pr(THD)$_3$, Pr(FOD)$_3$, (C$_5$Me$_4$H)$_3$Pr, Pr[OOCCH(C$_2$H$_5$)C$_4$H$_9$]$_3$, Pr(C$_{11}$H$_{19}$O$_2$)$_3$.CH$_3$(OCH$_2$CH$_2$)$_3$OCH$_3$, Pr(O($^i$Pr))$_3$, Pr(acac)$_3$, Pr(hfac)$_3$, Pr((($^t$Bu)$_2$N)$_2$CMe)$_3$, Pr((($^i$Pr)$_2$N)$_2$CMe)$_3$, Pr((($^t$Bu)$_2$N)$_2$C($^t$Bu))$_3$, and Pr((($^i$Pr)$_2$N)$_2$C($^t$Bu))$_3$.

Nd precursors: Nd(N(SiMe$_3$)$_2$)$_3$, Nd(N($^i$Pr)$_2$)$_3$, (($^i$Pr)Cp)$_3$Nd, Cp$_3$Nd, (C$_5$Me$_4$H)$_3$Nd, Nd(THD)$_3$, Nd[OOCCH(C$_2$H$_5$)C$_4$H$_9$]$_3$, Nd(O($^i$Pr))$_3$, Nd(acac)$_3$, Nd(hfac)$_3$, Nd(F$_3$CC(O)CHC(O)CH$_3$)$_3$, and Nd(FOD)$_3$.

Sm precursors: Sm(N(SiMe$_3$)$_2$)$_3$, (($^i$Pr)Cp)$_3$Sm, Cp$_3$Sm, Sm(THD)$_3$, Sm[OOCCH(C$_2$H$_5$)C$_4$H$_9$]$_3$, Sm(O($^i$Pr))$_3$, Sm(acac)$_3$, and (C$_5$Me$_5$)$_2$Sm.

Eu precursors: Eu(N(SiMe$_3$)$_2$)$_3$, (($^i$Pr)Cp)$_3$Eu, Cp$_3$Eu, (Me$_4$Cp)$_3$Eu, Eu(THD)$_3$, Eu[OOCCH(C$_2$H$_5$)C$_4$H$_9$]$_3$, Eu(O($^i$Pr))$_3$, Eu(acac)$_3$, and (C$_5$Me$_5$)$_2$Eu.

Gd precursors: Gd(N(SiMe$_3$)$_2$)$_3$, (($^i$Pr)Cp)$_3$Gd, Cp$_3$Gd, Gd(THD)$_3$, Gd[OOCCH(C$_2$H$_5$)C$_4$H$_9$]$_3$, Gd(O($^i$Pr))$_3$, and Gd(acac)$_3$.

Tb precursors: Tb(N(SiMe$_3$)$_2$)$_3$, (($^i$Pr)Cp)$_3$Tb, Cp$_3$Tb, Tb(THD)$_3$, Tb[OOCCH(C$_2$H$_5$)C$_4$H$_9$]$_3$, Tb(O($^i$Pr))$_3$, and Tb(acac)$_3$ Dy precursors: Dy(N(SiMe$_3$)$_2$)$_3$, (($^i$Pr)Cp)$_3$Dy, Cp$_3$Dy, Dy(THD)$_3$, Dy[OOCCH(C$_2$H$_5$)C$_4$H$_9$]$_3$, Dy(O(Pr))$_3$, Dy(O$_2$C(CH$_2$)$_6$CH$_3$)$_3$, and Dy(acac)$_3$.

Ho precursors: Ho(N(SiMe$_3$)$_2$)$_3$, (($^i$Pr)Cp)$_3$Ho, Cp$_3$Ho, Ho(THD)$_3$, Ho[OOCCH(C$_2$H$_5$)C$_4$H$_9$]$_3$, Ho(O($^i$Pr))$_3$, and Ho(acac)$_3$.

Er precursors: Er(N(SiMe$_3$)$_2$)$_3$, (($^i$Pr)Cp)$_3$Er, ((nBu)Cp)$_3$Er, Cp$_3$Er, Er(THD)$_3$, Er[OOCCH(C$_2$H$_5$)C$_4$H$_9$]$_3$, Er(O($^i$Pr))$_3$, and Er(acac)$_3$.

Tm precursors: Tm(N(SiMe$_3$)$_2$)$_3$, (($^i$Pr)Cp)$_3$Tm, Cp$_3$Tm, Tm(THD)$_3$, Tm[OOCCH(C$_2$H$_5$)C$_4$H$_9$]$_3$, Tm(O($^i$Pr))$_3$, and Tm(acac)$_3$.

Yb precursors: Yb(N(SiMe$_3$)$_2$)$_3$, Yb(N($^i$Pr)$_2$)$_3$, (($^i$Pr)Cp)$_3$Yb, Cp$_3$Yb, Yb(THD)$_3$, Yb[OOCCH(C$_2$H$_5$)C$_4$H$_9$]$_3$, Yb(O($^i$Pr))$_3$, Yb(acac)$_3$, (C$_5$Me$_5$)$_2$Yb, Yb(hfac)$_3$, and Yb(FOD)$_3$.

Lu precursors: Lu(N(SiMe$_3$)$_2$)$_3$, (($^i$Pr)Cp)$_3$Lu, Cp$_3$Lu, Lu(THD)$_3$, Lu[OOCCH(C$_2$H$_5$)C$_4$H$_9$]$_3$, Lu(O($^i$Pr))$_3$, and Lu(acac)$_3$.

In the above precursors, as well as precursors set forth below, the following common abbreviations are used: Si: silicon; Me: methyl; Et: ethyl; $^i$Pr: isopropyl; nPr: n-propyl; Bu: butyl; nBu: n-butyl; sBu: sec-butyl; $^i$Bu: iso-butyl; $^t$Bu: tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8,8-heptafluoro-2,2-dimethyl-3,5-octanedionate.

A plurality of embodiments for surface functionalization for subsequent high-k deposition have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of surface functionalization for high-k deposition, the method comprising:
providing a substrate that is at least substantially free of oxygen-containing compounds on a surface of the substrate;
forming an interface layer on the surface of the substrate that is at least substantially free of oxygen-containing compounds by exposing the surface of the substrate to one or more pulses of ozone gas;
modifying the interface layer by exposing the interface layer to one or more pulses of a treatment gas containing a functional group to form a functionalized interface layer terminated with the functional group; and
depositing a high-k film on the functionalized interface layer.

2. The method of claim 1, wherein the modifying includes exposing the interface layer to one or more pulses of a treatment gas selected from the group consisting of $H_2O$, $H_2O_2$, and $NH_3$.

3. The method of claim 2, wherein the functional group includes —OH, —NH, or —$NH_2$.

4. The method of claim 1, wherein the forming and modifying are repeated one or more times.

5. The method of claim 1, wherein the forming, modifying, and depositing are performed in a single process chamber.

6. The method of claim 1, wherein the forming, modifying, and depositing are performed without exposing the substrate to air.

7. The method of claim 1, wherein the forming, modifying, and depositing are performed at substantially the same substrate temperature.

8. The method of claim 1, wherein the substrate contains Si, Ge, or both Si and Ge.

9. The method of claim 1, wherein the interface layer includes $SiO_2$.

10. The method of claim 1, wherein the substrate that is at least substantially free of oxygen-containing compounds on a surface of the substrate is prepared by subjecting the substrate to a chemical oxide removal (COR) process or to a wet oxide removal process containing dilute hydrofluoric acid (DHF).

11. The method of claim 1, wherein a thickness of the interface layer is less than about 5 Angstrom.

12. The method of claim 1, wherein a thickness of the interface layer is less than about 4 Angstrom.

13. The method of claim 1, wherein the high-k film is deposited by a gas phase deposition method.

14. The method of claim 1, wherein the high-k film is deposited by an atomic layer deposition (ALD) method.

15. The method of claim 1, wherein the high-k film includes a hafnium-containing material, a zirconium-containing material, a titanium-containing material, an aluminum-containing material, or a material containing one or more rare earth metals.

16. The method of claim 1, wherein the high-k film includes $HfO_2$, HfSiO, $ZrO_2$, ZrSiO, $TiO_2$, or $Al_2O_3$.

17. The method of claim 1, further comprising forming a gate stack containing the high-k film and the interface layer.

18. The method of claim 1, wherein the high-k film and the interface layer form a contact structure for a metal/semiconductor contact.

19. A method of surface functionalization for high-k deposition, the method comprising:
providing a Si substrate that is at least substantially free of oxygen-containing compounds on a surface of the substrate;
forming a $SiO_2$ interface layer on the surface of the Si substrate that is at least substantially free of oxygen-containing compounds by exposing the surface of the substrate to a plurality of ozone gas pulses, wherein a thickness of the $SiO_2$ interface layer is less than 5 Å;
modifying the $SiO_2$ interface layer with a plurality of pulses of a treatment gas containing a —OH functional group to form a functionalized surface terminated with the —OH functional group; and
depositing a high-k film on the functionalized surface by atomic layer deposition (ALD).

20. The method of claim 19, wherein the modifying includes exposing the $SiO_2$ interface layer to one or more pulses of a treatment gas selected from the group consisting of $H_2O$, $H_2O_2$, and $NH_3$.

* * * * *

UNITED STATES PATENT AND TRADEMARK OFFICE
CERTIFICATE OF CORRECTION

PATENT NO. : 9,607,829 B2  
APPLICATION NO. : 14/619984  
DATED : March 28, 2017  
INVENTOR(S) : Kandabara N. Tapily et al.

Page 1 of 1

It is certified that error appears in the above-identified patent and that said Letters Patent is hereby corrected as shown below:

In the Specification

Column 8, Line 30, reads "$Dy(THD)_3$, $Dy[OOCCH(C_2H_5)C_4H_9]_3$, $Dy(O(Pr))_3$," and should read -- $Dy(THD)_3$, $Dy[OOCCH(C_2H_5)C_4H_9]_3$, $Dy(O(^iPr))_3$, --.

Signed and Sealed this  
Twentieth Day of June, 2017

Joseph Matal  
*Performing the Functions and Duties of the*  
*Under Secretary of Commerce for Intellectual Property and*  
*Director of the United States Patent and Trademark Office*